United States Patent
Renn

(10) Patent No.: US 7,948,028 B2
(45) Date of Patent: May 24, 2011

(54) DRAM DEVICE HAVING A GATE DIELECTRIC LAYER WITH MULTIPLE THICKNESSES

(75) Inventor: Shing-Hwa Renn, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 160 days.

(21) Appl. No.: 12/049,385

(22) Filed: Mar. 17, 2008

(65) Prior Publication Data

US 2009/0114966 A1 May 7, 2009

(30) Foreign Application Priority Data

Nov. 6, 2007 (TW) ................... 96141857 A

(51) Int. Cl.
*H01L 29/66* (2006.01)
(52) U.S. Cl. .......... 257/330; 257/E29.26; 257/396; 257/288; 257/331; 257/332; 257/520; 257/559
(58) Field of Classification Search ............ 257/68, 257/283, 284, 296, 301–305, 330–334, 374, 257/397, 513, 514, 622, 647, 648, E29.345, 257/E29.26, 396, 288, 520, 559
See application file for complete search history.

(56) References Cited

U.S. PATENT DOCUMENTS

| 5,640,034 A | 6/1997 | Malhi |
| 6,359,308 B1 * | 3/2002 | Hijzen et al. ............ 257/341 |
| 2004/0224476 A1 | 11/2004 | Yamada |
| 2004/0248364 A1 | 12/2004 | Hsiao |
| 2005/0275014 A1 * | 12/2005 | Kim et al. ............ 257/330 |
| 2006/0163631 A1 * | 7/2006 | Chen et al. ............ 257/296 |
| 2007/0052013 A1 * | 3/2007 | Kim et al. ............ 257/330 |
| 2007/0075351 A1 * | 4/2007 | Schulz et al. ............ 257/314 |
| 2007/0132016 A1 | 6/2007 | Elwin |
| 2007/0148876 A1 * | 6/2007 | Yu ............ 438/275 |
| 2009/0014813 A1 * | 1/2009 | Chao et al. ............ 257/407 |

FOREIGN PATENT DOCUMENTS

DE 103 59 493 A1 2/2005
DE 10 2006 034 772 A1 7/2007
* cited by examiner

*Primary Examiner* — N Drew Richards
*Assistant Examiner* — Jae Lee
(74) *Attorney, Agent, or Firm* — Winston Hsu; Scott Margo

(57) ABSTRACT

A transistor device employed in a support circuit of a DRAM includes a semiconductor substrate having thereon a gate trench, a recessed gate embedded in the gate trench, a source doping region disposed at one side of the recessed gate, a drain doping region disposed at the other side of the recessed gate, and a gate dielectric layer between the recessed gate and the semiconductor substrate. The gate dielectric layer has at least two thicknesses that render the high-voltage transistor device asymmetric. The thicker gate dielectric layer is between the recessed gate and the drain doping region, while the thinner gate dielectric layer is between the recessed gate and the source doping region.

6 Claims, 3 Drawing Sheets

DRAM DEVICE HAVING A GATE DIELECTRIC LAYER WITH MULTIPLE THICKNESSES

BACKGROUND OF THE INVENTION

1. Field of the Invention

The present invention relates to the field of DRAM device technology. More particularly, the present invention relates to a transistor device having a dielectric layer with multiple thicknesses and employed in a support circuit.

2. Description of the Prior Art

As known in the art, DRAM cells are typically operated under relatively high voltages. To maintain performance of the DRAM cells, the reliability of gate dielectric layer of the high-voltage MOS transistor devices disposed in the support circuit of the DRAM is very critical.

At present, to solve the troublesome boron penetration problem that typically occurs in a P+ gate MOS transistor device, a known decoupled plasma nitridation or DPN technique is employed to introduce nitrogen into the gate dielectric layer in the DRAM support circuit. However, the introduction of high concentration of nitrogen atoms in the gate dielectric layer of the high-voltage N+ gate MOS transistors deteriorates the reliability of the gate dielectric layer.

In light of the above, there is a strong need in this industry to provide a solution when facing the tradeoff between the performance of the P+ gate MOS transistor devices of the DRAM support circuit and the gate dielectric layer reliability of the high-voltage N+ gate MOS transistor devices.

SUMMARY OF THE INVENTION

Therefore, it is one object of the present invention to provide an improved NMOS transistor device employed in the DRAM support circuit, which not only increases the performance of the low-voltage P+ gate MOS transistor device of the DRAM support circuit, but also increases the gate dielectric layer reliability of the high-voltage N+ gate MOS transistor devices.

According to the claimed invention, a DRAM device includes a semiconductor substrate having a memory array region and a support circuit region, wherein a first recess gate is disposed within the memory array region and a second recess gate is disposed within the support circuit region, and wherein the first and second recess gates are inlaid into the semiconductor substrate; a first gate dielectric layer between the first recess gate and the semiconductor substrate, wherein the first gate dielectric layer has a uniform thickness; and a second gate dielectric layer between the second recess gate and the semiconductor substrate, wherein the second gate dielectric layer has a variable thickness.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
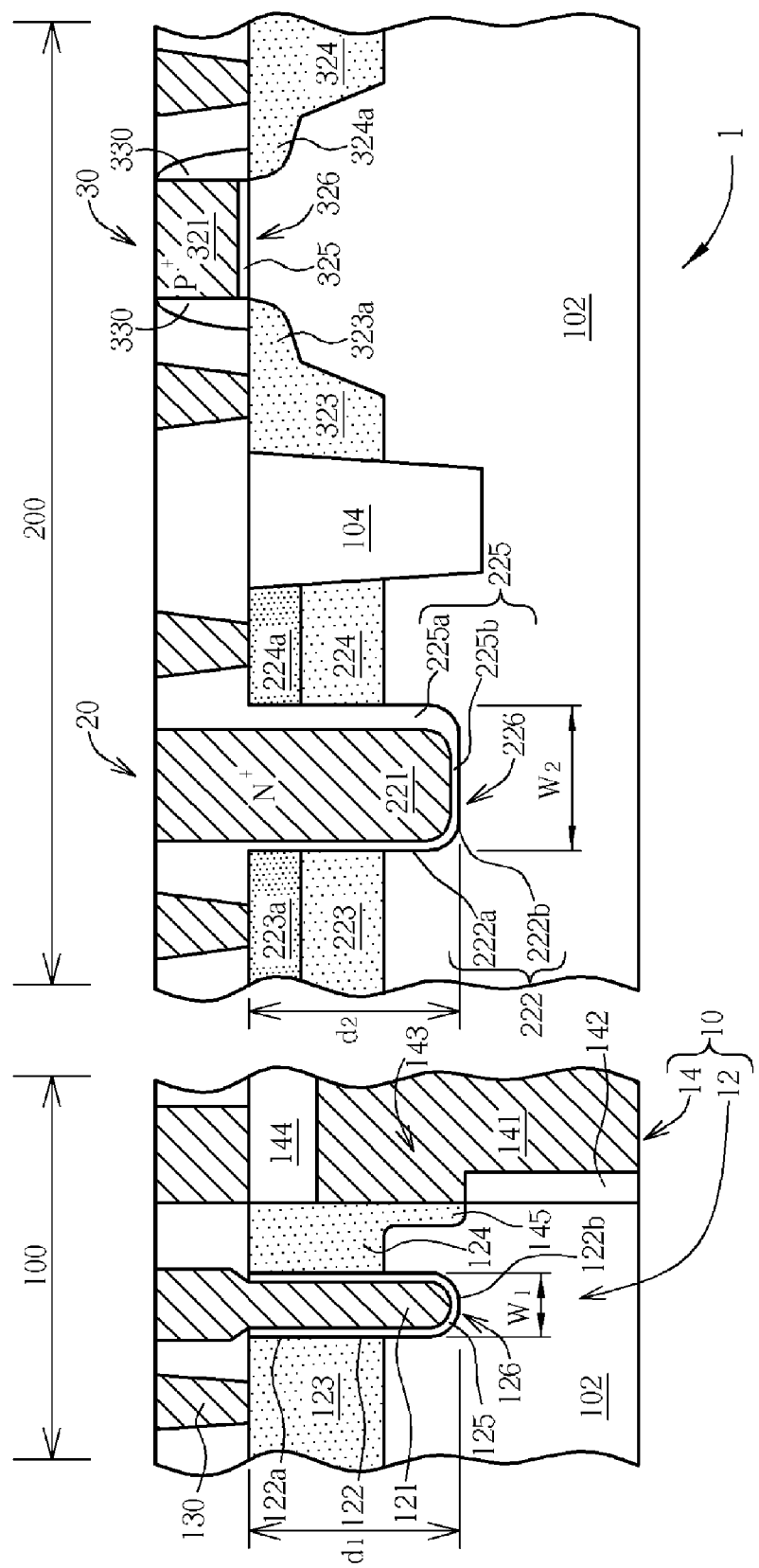
FIG. 1 is a schematic, cross-sectional diagram showing a portion of a DRAM device in accordance with one preferred embodiment of this invention.

FIG. 1 is a schematic, cross-sectional diagram showing a portion of a DRAM device 1 in accordance with one preferred embodiment of this invention. As shown in FIG. 1, the DRAM device 1 includes a memory array region 100 and a support circuit region 200. A plurality of memory cells 10 are provided in the memory array region 100 and each of the memory cells 10 consists of an extended U-shape device (EUD) 12 and a deep trench capacitor 14.

For the sake of simplicity, merely one memory cell 10 is illustrated in FIG. 1. The aforesaid extended U-shape device 12 is also known as a recess channel array transistor (RCAT) or recess-gate MOS transistor device.

The extended U-shape device 12 includes a recess gate 121, a source doping region 123, a drain doping region 124 and a gate dielectric layer 125, wherein the recess gate 121 is inlaid into a gate trench 122 that is etched into a predetermined depth of a semiconductor substrate 102. The recess gate 121 may include polysilicon, metals or any combination thereof. The gate dielectric layer 125 may include silicon oxide ($SiO_2$).

The gate trench 122 comprises a vertical sidewall 122a and a U-shaped bottom 122b. The U-shaped channel 126 of the extended U-shape device 12 is just located at the U-shaped bottom 122b.

The deep trench capacitor 14 includes a doped polysilicon layer 141 and a sidewall capacitor dielectric layer 142 such as an oxide-nitride-oxide (ONO) dielectric structure. The doped polysilicon layers 141 functions as a top electrode of the deep trench capacitor 14.

For the sake of simplicity, merely the upper portion of the deep trench capacitor 14 is schematically shown in FIG. 1, while the lower portion of the deep trench capacitor including the buried plate (capacitor bottom plate) is not shown.

A so-called Single-Sided Buried Strap (SSBS) process is carried out to form single-sided buried strap 143 in the upper portion of the deep trench capacitor 14. Subsequently, a Trench Top isolation Layer such as a Trench Top Oxide (TTO) layer 144 is formed. The TTO layer 144 may be made of silicon oxide deposited by high-density plasma chemical vapor deposition methods.

The aforesaid SSBS process generally comprises the steps of etching back the sidewall capacitor dielectric layer 142 and the doped polysilicon (or so-called Poly-2) 141 to a first depth; refilling the recess with another layer of polysilicon (or so-called Poly-3); etching back the Poly-3 to a second depth; forming an asymmetric spacer on interior sidewall of the recess; etching away the Poly-3 and Poly-2 that are not covered by the asymmetric spacer; filling the recess with TTO insulation layer; and chemical mechanical polishing the TTO insulation layer to form the TTO layer 144.

As shown in FIG. 1, the drain doping region 124 of the extended U-shape device 12 is coupled to an out-diffusion region 145 adjacent to the single-sided buried strap 143 of the deep trench capacitor 14. The conductive plug 130, the source doping region 123 of the extended U-shape device 12, the turned-on U-shaped channel 126, the drain doping region 124 and the out-diffusion region 145 constitute a conductive path between the bit line and the top electrode of the deep trench capacitor 14. Electron or electric current flows through the aforesaid conductive path to accomplish data storage or access.

According to the preferred embodiment of this invention, the gate trench 122 of the extended U-shape device 12, which is used to accommodate the recess gate 121, has a depth $d_1$ ranging between 1500 angstroms and 2500 angstroms and a width $w_1$ ranging between 200 angstroms and 600 angstroms.

According to the preferred embodiment of this invention, at least one high-voltage MOS transistor device 20 and a low-voltage MOS transistor device 30 are disposed in the support circuit region 200 of the semiconductor substrate 102. A shallow trench isolation (STI) structure 104 may be formed between the high-voltage MOS transistor device 20 and the low-voltage MOS transistor device 30 to isolation the high-voltage MOS transistor device 20 from the low-voltage MOS transistor device 30.

The high-voltage MOS transistor device 20 comprises a recess gate 221, a source doping region 223, a drain doping region 224 and a gate dielectric layer 225. The recess gate 221 is inlaid into a gate trench 222 that is etched into a predetermined depth of a semiconductor substrate 102. The recess gate 221 may include polysilicon, metals or any combination thereof. And the gate dielectric layer 225 may include silicon oxide ($SiO_2$).

According to the preferred embodiment of this invention, the high-voltage MOS transistor device 20 is an NMOS transistor and the recess gate 221 is an $N^+$ doped polysilicon gate. The source doping region 223 may further comprise a heavily-doped $N^+$ doping surface region 223a and the drain doping region 224 may further comprise a heavily-doped $N^+$ doping surface region 224a.

The gate trench 222 is divided into two portions: vertical sidewall 222a and U-shaped bottom 222b. The U-shaped channel 226 of the high-voltage MOS transistor device 20 is just located at the U-shaped bottom 222b. According to the preferred embodiment of this invention, the gate trench 222 used to accommodate the recess gate 221 has a depth $d_2$ that is the same as $d_1$, wherein $d_2$ ranges between 1500 angstroms and 2500 angstroms, while the gate trench 222 has a width $w_2$ ranging between 1300 angstroms and 1600 angstroms, which is much wider than $w_1$.

One germane feature of the present invention is that the gate structure of the high-voltage MOS transistor device 20 in the support circuit region 200 and the gate structure of the extended U-shape device 12 in the memory array region 100 are both embedded into the semiconductor substrate 102. Therefore, the fabrication processes of the high-voltage MOS transistor device 20 and the extended U-shape device 12 are compatible.

Another germane feature of the present invention is that the gate dielectric layer 225 of the high-voltage MOS transistor device 20 has different and variable thicknesses, thus presenting an asymmetric gate dielectric layer structure, wherein the thicker gate dielectric layer 225a is disposed between the recess gate 221 and the drain doping region 224 of the high-voltage MOS transistor device 20, while the thinner gate dielectric layer 225b is disposed between the recess gate 221 and the source doping region 223.

The gate dielectric layer 225b extends from the vertical sidewall 222a of the gate trench 222 adjacent to the source doping region 223 down to the U-shaped bottom 222b. According to the preferred embodiment of this invention, the gate dielectric layer 225a has a thickness ranging between 150 angstroms and 300 angstroms and the gate dielectric layer 225b has a thickness ranging between 20 angstroms and 60 angstroms.

According to the preferred embodiment of this invention, the low-voltage MOS transistor device 30 is a planar-channel PMOS transistor comprising a gate 321, a $P^+$ source doping region 323, a $P^+$ drain doping region 324 and a gate dielectric layer 325. According to the preferred embodiment of this invention, the gate 321 is a $P^+$ doped polysilicon gate. A spacer 330 may be formed on the sidewall of the gate 321. The $P^+$ source doping region 323 may further comprise a lightly doped drain (LDD) region 323a and the $P^+$ drain doping region 324 may further comprise an LDD region 324a. A planar channel 326 is defined between the LDD regions 323a and 324a.

Figure 2:
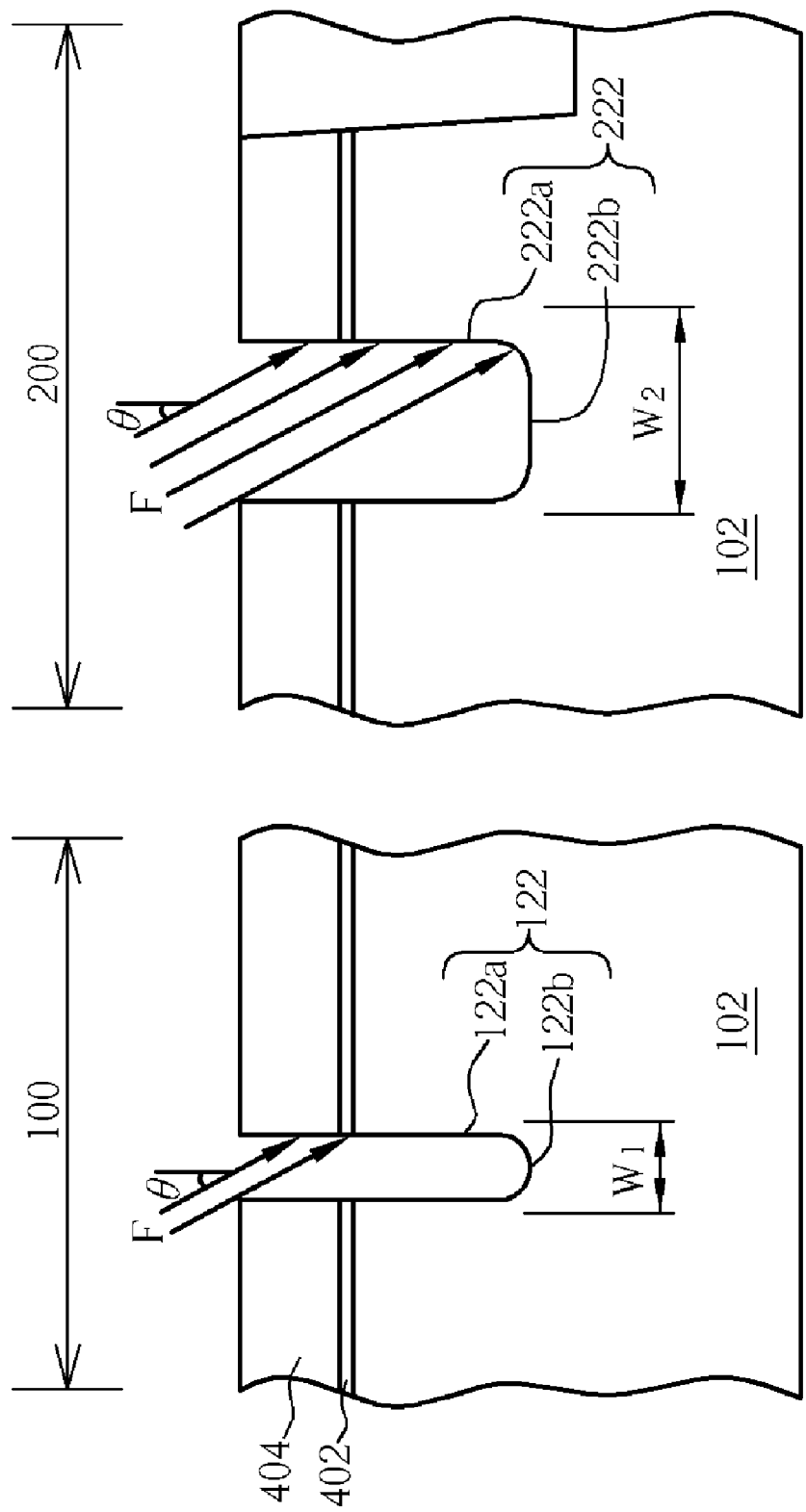
FIG. 2 and FIG. 3 are schematic, cross-sectional diagrams showing the exemplary method for forming the asymmetric gate dielectric layer 225 of the high-voltage MOS transistor device 20 in accordance with the preferred embodiment of this invention.
Figure 3:
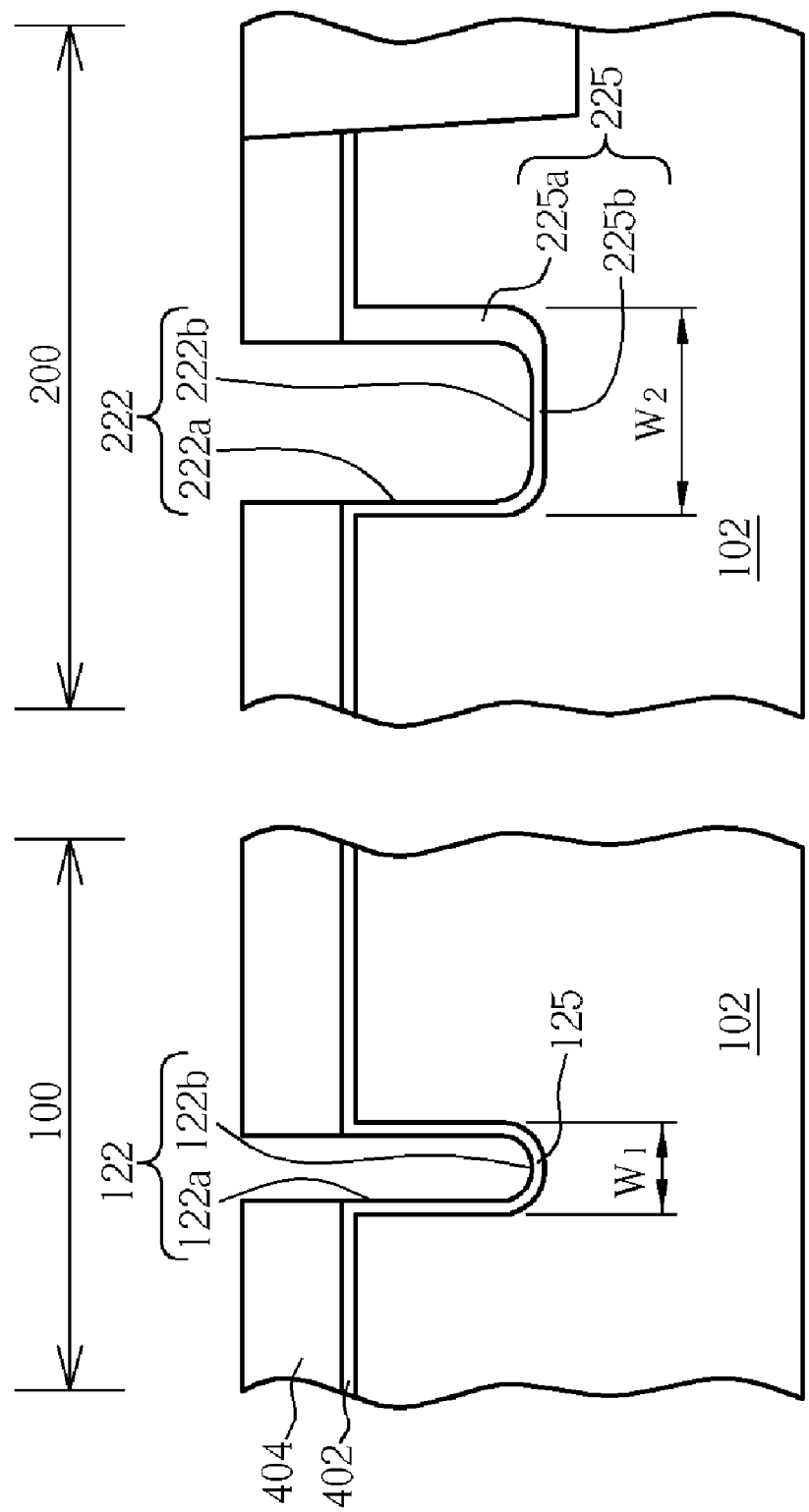

FIG. 2 and FIG. 3 are schematic, cross-sectional diagrams showing the exemplary method for forming the asymmetric gate dielectric layer 225 of the high-voltage MOS transistor device 20 in accordance with the preferred embodiment of this invention, wherein like numeral numbers designate like regions, layers or structures. As shown in FIG. 2, a pad dielectric layer 402 and a pad nitride layer 404 are provided on the main surface of the semiconductor substrate 102. Subsequently, a conventional lithographic process and a conventional etching process are carried out to form a gate trench 122 in the memory array region 100 and a gate trench 222 in the support circuit region 200 respectively. The gate trench 122 includes a vertical sidewall 122a and U-shaped bottom 122b and the gate trench 222 includes a vertical sidewall 222a and U-shaped bottom 222b.

The depth of the gate trench 122 and the depth of the gate trench 222 are substantially the same. However, the gate trench 222 has a width $w_2$, which is much wider than the width ($w_1$) of the gate trench 122. According to the preferred embodiment of this invention, $w_2$ ranges between 1300 angstroms and 1600 angstroms and $w_1$ ranges between 200 angstroms and 600 angstroms.

Subsequently, a tilt-angle ion implantation process is performed to implant pre-selected dopants such as fluorine into one single side of the vertical sidewall 222a of the gate trench 222 at a pre-determined angle θ. According to the preferred embodiment of this invention, a small portion of the U-shaped bottom 222b may be implanted with the aforesaid dopants in the tilt-angle ion implantation process.

According to the preferred embodiment of this invention, the aforesaid pre-determined angle θ of the tilt-angle ion implantation process may range between 0 degree and 30 degree, preferably between 10 degree and 15 degree. The aforesaid dopants can cause the difference of gate dielectric layer growth rates between doped area and non-doped area in the subsequent gate dielectric layer oxidation process.

The aforesaid dopants used in the tilt-angle ion implantation process do not affect the vertical sidewall 122a and the U-shaped bottom 122b of the gate trench 122, especially the U-shaped bottom 122b, since the width of the gate trench 122 in the memory array region 100 is much smaller than that of the gate trench 222 in the support circuit region 200.

As shown in FIG. 3, after the tilt-angle ion implantation process, a thermal oxidation process such as a furnace process is carried out to form a gate dielectric layer 125 inside the gate trench 122 and a gate dielectric layer 225 inside the gate trench 222. The fluorine-doped single side of the vertical sidewall 222a of the gate trench 222 has faster dielectric layer growth rate than the non-doped area inside the gate trench 222. Therefore, a thicker gate dielectric layer 225a is formed.

The gate dielectric layer 225 of the high-voltage MOS transistor device 20 has at least two different thicknesses, thus presenting an asymmetric gate dielectric layer structure. According to the preferred embodiment of this invention, the gate dielectric layer 225a has a thickness ranging between 150 angstroms and 300 angstroms and the gate dielectric layer 225b has a thickness ranging between 20 angstroms and 60 angstroms.

As previously mentioned, since the dopants used in the tilt-angle ion implantation process are not implanted into the vertical sidewall 122a and the U-shaped bottom 122b of the gate trench 122, especially the U-shaped bottom 122b of the gate trench 122, the tilt-angle ion implantation process does not affect the transistor processes within the memory array region 100.

Those skilled in the art will readily observe that numerous modifications and alterations of the device and method may be made while retaining the teachings of the invention.

What is claimed is:

1. A DRAM device, comprising:
   a semiconductor substrate having a memory array region and a support circuit region;
   a first recess gate transistor in the memory array region, comprising a first recess gate inlaid into a first gate trench, a first source doping region at one side of the first gate trench, a first drain doping region at the other side of the first gate trench opposite to the first source doping region, a first U-shaped channel at a bottom of the first gate trench, and a first gate dielectric layer formed between the first recess gate and the semiconductor substrate, wherein the first gate dielectric layer has a uniform thickness;
   a second recess gate transistor in the support circuit region, comprising a second recess gate inlaid into a second gate trench, a second source doping region at one side of the second gate trench, a second drain doping region at the other side of the second gate trench opposite to the second source doping region, a second U-shaped channel at a bottom of the second gate trench, and a second gate dielectric layer formed between the second recess gate and the semiconductor substrate, wherein the second recess gate transistor is a high-voltage NMOS transistor and the second gate dielectric layer has variable thicknesses; and
   a low-voltage PMOS transistor within the support circuit region, wherein the low-voltage PMOS transistor is a planar-channel PMOS transistor.

2. The DRAM device according to claim 1, wherein the first and the second recess gates are $N^+$ doped polysilicon gates.

3. The DRAM device according to claim 1, wherein each of the first and second recess gates comprises polysilicon.

4. The DRAM device according to claim 1, wherein each of the first and second recess gates comprises metals.

5. The DRAM device according to claim 1, wherein each of the first and second recess gates comprises a combination of polysilicon and metals.

6. The DRAM device according to claim 1, wherein the second gate trench has a width that is wider that that of the first gate trench.

* * * * *